(12) United States Patent
Dittfeld et al.

(10) Patent No.: US 9,676,357 B2
(45) Date of Patent: Jun. 13, 2017

(54) DIAGNOSIS OF INTEGRATED DRIVER CIRCUITS

(75) Inventors: Timo Dittfeld, Munich (DE); Wolfgang Scherr, Villach/Landskron (AT)

(73) Assignee: Infineon Technologies AG, Neubiberg (DE)

( * ) Notice: Subject to any disclaimer, the term of this patent is extended or adjusted under 35 U.S.C. 154(b) by 576 days.

(21) Appl. No.: 12/816,053

(22) Filed: Jun. 15, 2010

(65) Prior Publication Data

US 2011/0307209 A1     Dec. 15, 2011

(51) Int. Cl.
*B60R 21/017*     (2006.01)
*G01R 31/00*     (2006.01)

(52) U.S. Cl.
CPC ........ *B60R 21/0173* (2013.01); *G01R 31/007* (2013.01)

(58) Field of Classification Search
CPC ....................................................... G01R 3/00
USPC ... 702/31, 65, 120, 132, 179, 182, 183, 185, 702/186; 701/36; 715/790
See application file for complete search history.

(56) References Cited

U.S. PATENT DOCUMENTS

| | | | | |
|---|---|---|---|---|
| 5,032,903 A | * | 7/1991 | Suzuki | H04N 1/00352 358/448 |
| 5,063,516 A | * | 11/1991 | Jamoua | G01R 31/007 340/635 |
| 5,438,844 A | * | 8/1995 | Hoglund | F25B 49/02 62/127 |
| 6,420,935 B1 | * | 7/2002 | Harris | H01P 1/2138 330/295 |
| 6,647,328 B2 | * | 11/2003 | Walker | 701/36 |
| 7,089,780 B2 | * | 8/2006 | Sunshine et al. | 73/23.2 |
| 7,606,679 B1 | * | 10/2009 | Voicu et al. | 702/183 |
| 7,693,625 B2 | * | 4/2010 | Bauerle et al. | 701/30.7 |
| 7,802,198 B2 | * | 9/2010 | Obradovich | 715/790 |
| 8,417,490 B1 | * | 4/2013 | Preston et al. | 703/2 |

* cited by examiner

*Primary Examiner* — Alexander Satanovsky
*Assistant Examiner* — Felix Suarez
(74) *Attorney, Agent, or Firm* — Slater Matsil, LLP

(57) ABSTRACT

A circuit arrangement includes a controller and an integrated driver arrangement coupled to the controller. The integrated driver circuit includes a driver unit having at least one operation parameter, and a diagnostic unit coupled to the driver unit. The diagnostic unit is adapted to retrieve the at least one operation parameter from the driver unit, and is coupled to the controller.

32 Claims, 6 Drawing Sheets

DIAGNOSIS OF INTEGRATED DRIVER CIRCUITS

TECHNICAL FIELD

The present disclosure relates to the diagnosis of integrated driver circuits. The disclosure in particular relates to integrated driver circuits that are used in an automotive environment, such as integrated driver circuits in a passenger protection system.

BACKGROUND

Passenger protection systems, such as restraint systems or airbag systems, include a controller and include at least one sensor, and an integrated driver circuit, each being connected to the controller. The driver circuit controlled by the controller triggers the restraint system. An airbag system includes a squib as a triggering element, the squib being connected to the driver arrangement. The squib is ignited—and the airbag is triggered—by driving a current provided by the driver circuit through the squib.

Driver circuits in safety systems, such as passenger protection system, regularly need to be checked for errors that may affect proper function of the driver circuit and, therefore, the protection system. A diagnostic function for regularly checking the driver arrangement may be implemented in the controller. However, diagnostic routines running on the controller considerably influence the workload of the controller. In some systems diagnostic functions make up to 50% of the controllers workload.

There is therefore a need to reduce the workload resulting from diagnostic functions of a controller in an arrangement that includes an integrated driver circuit.

SUMMARY OF THE INVENTION

An aspect of the present disclosure relates to a circuit arrangement comprising a controller and an integrated driver arrangement coupled to the controller. In this arrangement the integrated driver arrangement includes: a driver unit having at least one operation parameter; a diagnostic unit coupled to the driver unit, the diagnostic unit being adapted to retrieve the at least one operation parameter from the driver unit, and being coupled to the controller.

BRIEF DESCRIPTION OF THE DRAWINGS

Examples will now be explained with reference to the accompanying drawings and the description below. The drawings are intended to explain the basic principle. Therefore, only those features relevant for illustrating the basic principle are shown. Unless stated otherwise, same reference characters designate the same features with the same meaning throughout the drawings.

DETAILED DESCRIPTION OF ILLUSTRATIVE EMBODIMENTS

The present disclosure relates to a circuit arrangement that includes an integrated driver circuit and to a method of diagnosing the integrated driver circuit. The arrangement and the method will be described with respect to exemplary embodiments in a specific context, namely a control circuit in a passenger protection system, such as a restraint or an airbag system. However, this is only an example. The concepts explained below are, of course, also applicable to other circuit arrangements that include a driver circuit that regularly requires diagnosis.

Figure 1:
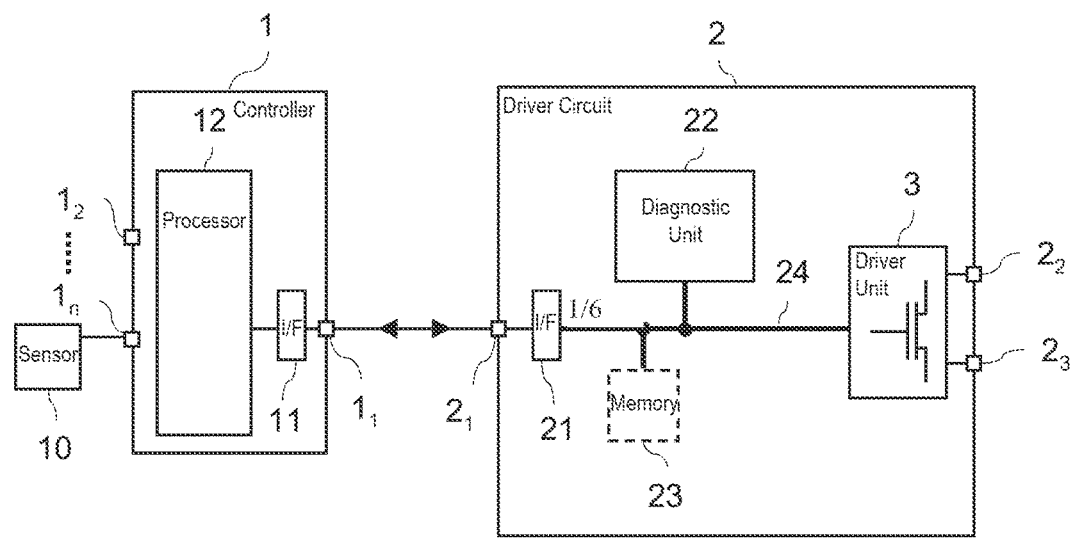
FIG. 1 illustrates a circuit arrangement including a controller and an integrated driver circuit coupled to the controller, according to a first example.

FIG. 1 illustrates a block diagram of a circuit arrangement including a controller 1 and a driver circuit 2 coupled to the controller 1. Controller 1 is, for example, a microcontroller. Controller 1 and driver circuit 2 each have a first communication port $1_1$, $2_1$, with a communication channel running between these two first communication ports $1_1$, $2_1$. The communication channel is adapted to allow signal communication between controller 1 and driver circuit 2 in both directions. The communication channel is only schematically illustrated in FIG. 1. This channel can be implemented using any suitable technology for implementing a data channel, such as the $I^2C$-bus-technology, the μSB-technology, or the Serial-Parallel-Interface-(SPI)-technology. The channel can be a bidirectional channel, allowing signal communication in both directions via the same physical lines, or may include two or more unidirectional channels, each allowing signal communication only in one direction. A bidirectional channel may, for example, include two data lines and one synchronization line. Optionally, additional control lines, such as a chip-select line, or an interrupt line, may be used. The first communication ports $1_1$, $2_1$ are only schematically shown. These ports, dependent on the channel, may each include a number of physical ports, this number corresponding to the number of physical lines the communication channel includes between controller 1 and driver arrangement 2.

Controller 1 and driver arrangement 2 each have an interface circuit 11, 21 that is coupled to the corresponding first communication port $1_1$, $2_1$. These interface circuits 11, 21 are adapted to transform signals internally provided in one of the controller 1 and the driver circuit 2 into signals that are suitable to be transmitted via the communication channel. Interface circuits 11, 21 are, for example, serial peripheral interfaces (SPI) that map parallel signal streams that are processed in the controller 1 and the driver arrangement 2 onto a serial signal stream to be transferred via the communication channel.

Controller 1 includes a processing unit 12 that is coupled to interface unit 11. Processing unit 12 is adapted to process information provided to controller 1 from the driver arrangement 2 via the first communication port $1_1$ and/or information provided to controller 1 via further communication ports $1_2$, $1_n$. Corresponding to the interface unit 11 which is connected between the first communication port $1_1$ and the processing unit 12 similar interface circuits (not shown) may be connected between the further communication ports $1_2$, $1_n$ and the processing unit 12. In FIG. 1 only two further communication ports $1_2$, $1_n$ are shown. However, depending on the particular application controller 1 may include up to 10, up to 20 or even more further communication ports. Controller 1 processes the information it receives via its communication ports $1_1$, $1_2$, $1_n$ in order to generate a control signal for a driver unit 3 in driver circuit 2. Such control signal is transmitted via the communication channel from controller 1 to the driver circuit 2, and within the driver circuit 2 to driver unit 3. Driver unit 3 is connected to at least two load or supply terminals $2_2$, $2_3$ to which a load or a voltage source may be connected to.

Controller 1 and driver circuit 2 may be integrated in at least two different semiconductor chips (dies). In operation of the system, controller 1 and driver circuit 2 can be arranged distant to one another. The individual function blocks of driver circuit 2 may be integrated in a common semiconductor chip. This chip may include a logic section in which, for example circuit devices of the diagnostic circuit are integrated, and a power section in which, for example, power switches of the driver unit 3 are integrated. However, the different function units of driver circuit 3 could as well be integrated in different semiconductor bodies that are, for example, arranged in a chip-on-chip or a chip-by-chip arrangement. Controller 1 may be implemented using logic semiconductor components, such as transistors, in a 5V technology or a 3.3V technology, respectively, while the driver circuit 2 may be implemented using a "power technology". A power technology allows semiconductor components, such as transistors, to be realized that have voltage blocking capabilities of several 10 volts up to—depending on the technology—several hundred volts.

However, there are also "mixed-technologies" that allow logic and power components be realized in separate modules on one semiconductor chip. Using such mixed-technology, controller 1 and driver circuit 2 may be integrated in different modules on one semiconductor chip.

The circuit arrangement illustrated in FIG. 1 is, for example, part of a control circuit of an automotive passenger protection system. Such passenger protection systems besides a controller, such as controller 1 illustrated in FIG. 1, and a driver circuit, such as driver circuit 2 illustrated in FIG. 1, include at least one sensor, such as an acceleration sensor, providing acceleration information to controller 1 via one of its further communication ports $1_2$, $1_n$. A sensor arrangement 10 coupled to port $1_n$ is schematically illustrated in FIG. 1. This sensor arrangement 10 includes at least one sensor and can include additional circuits, such as level-shifters, which adapt signals provided by the sensor to a signal range that can be processed by the controller.

Usually several sensors are used, whereas each of these sensors provides one of the following information to the controller 1: acceleration information, such as information on a negative acceleration resulting from abrupt breaking, or information on a positive acceleration resulting from a crash event; buckle switch information, which is information on whether passengers are buckled up; yaw information, which is information on the rotation of a vehicle around its middle axis; pitch information, which is information on the car's actual pitch; roll information, which is information on whether the car is rolling over; pressure information, which is information on the pressure in cavities of the car body, like cavities in the door, that can be used for detecting a crash event. If the information provided to controller 1 indicates that activation of the passenger protection system is required, then controller 1 forwards an activation or firing signal or command to driver unit 3. This activation or firing signal causes driver unit 3 to trigger an activation element of the passenger protection system, the activation element being connected to the at least two output terminals $2_2$, $2_3$. In this connection it should be mentioned that a "firing signal" can be represented by any type of signal or information transmitted from the controller 1 to the driver unit 3 which causes the driver unit 3 to trigger the activation element. In an airbag system the activation element is a squib coupled to driver unit 3. This basic functionality of a passenger protection system that includes a controller and a driver circuit is commonly known and has only been briefly described in order to ease understanding of the following explanation.

In safety systems, such as passenger protection systems, driver unit 3 should regularly be checked or diagnosed to assure its proper function. The purpose of such diagnosis is to detect fault states of the driver unit 3, wherein such fault states can result from faults within the driver unit 3, but also from faults in connection lines to the driver unit 3, such as connection lines in the car wire harness between an engine control unit (ECU) and the squib. Fault states are, for example, states in which driver unit 3 is either disabled to trigger the activation element upon receiving an activation signal from controller 1, or is likely to trigger the activation element spontaneously without receiving an activation signal. Driver unit 3 has at least one operation parameter that is suitable to detect a fault state or to verify proper functionality.

Referring to FIG. 1 drive circuit 2 includes a diagnostic unit 22 coupled to driver unit 3. Diagnostic unit 22 is adapted to retrieve at least one operation parameter from driver unit 3, and to evaluate this operation parameter in order to detect a fault state of driver unit 3.

Diagnostic unit 22 is adapted to regularly poll the at least one operation parameter from driver unit 3 and to evaluate the retrieved operation parameter. Diagnostic unit 22 includes logic circuitry that may be realized as an ASIC (application specific integrated circuit) or ASSP (application specific semiconductor product). According to an embodiment parameters used in the diagnostic unit 22 can be set from externally by, for example, storing these parameters in a register. According to a further embodiment diagnostic unit 22 is programmable and includes an RAM for storing a program that defines the function of the diagnostic unit. Diagnostic circuit 22 may further include a storage memory (not shown), such as a register, for storing references value for the at least one operation parameter to be evaluated.

In the example of FIG. 1 both, driver unit 3 and diagnostic unit 22, are coupled to an internal signal bus 24 within driver circuit 2, signal bus 24 allowing signal communication between diagnostic unit 22 and driver unit 3. Further, signal bus 24 is coupled to the first communication port $2_1$ via interface circuit 21, thereby allowing signal communication between controller 1 and the components coupled to the internal bus 24.

Diagnostic unit 22 reports the diagnostic results obtained by comparing the at least one operation parameter with the corresponding reference values to controller 1. According to the example illustrated in FIG. 1 diagnostic unit 22 stores the diagnostic results in a storage memory 23, such as a register, coupled to the internal bus 24. Controller 1 is adapted to regularly poll the diagnostic results stored in the register 3 via the communication channel between controller 1 and driver circuit 2. According to a further embodiment, controller 1 polls the diagnostic result stored in the register only when required, i.e. when there is a diagnostic result that requires action to be taken by the controller.

The integration of diagnostic unit 22 in the driver circuit 2 reduces the workload of controller 1. The complete signal communication required to poll operation parameters from driver unit 3 is handled by diagnostic unit 22. Optionally diagnostic unit 22 also evaluates the retrieved operation parameters in order to obtain diagnostic results, and stores the results in storage memory 23. Controller 1 only needs to poll the operation parameters or the diagnostic results from memory 23.

In case the diagnostic results indicate a fault state of driver unit 3, controller 1 is adapted to take suitable actions, these actions may include: interrupting the power supply of the protection system in order to prevent unintended activation of the system, and/or issuing warning messages to users of the protection system (passengers of the car).

In the present system no synchronization is required between polling operation parameters from driver unit 3 and processing these operation parameters in order to obtain diagnostic results on the one hand, and polling diagnostic results by the controller 1 on the other hand. Controller 1 may poll the diagnostic results each time it has processing resources to do so.

Figure 2:
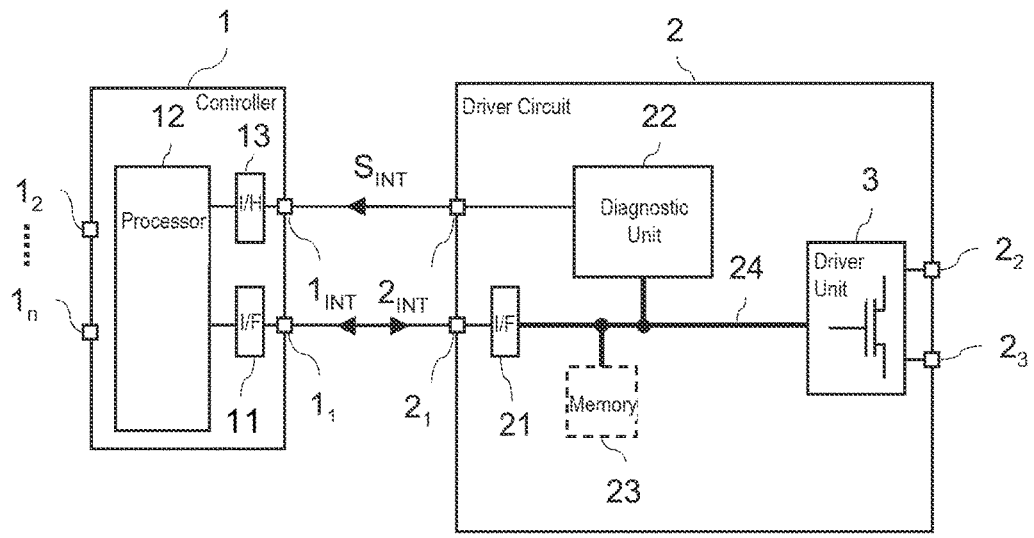
FIG. 2 illustrates a circuit arrangement including a controller and an integrated driver circuit coupled to the controller, according to a second example.

In order to reduce the time between detecting a fault state of the driver unit 3 and providing information on the fault state to controller 1 a circuit arrangement to another example includes a direct communication path between diagnostic unit 22 and controller 1. FIG. 2 schematically illustrates an example of a circuit arrangement including such direct communication path. In this circuit arrangement controller 1 and driver circuit 2 have communication ports $1_{INT}$, $2_{INT}$ that will be referred to as interrupt ports in the following. Controller 1 includes an interrupt handler 13 connected between its interrupt port $1_{INT}$ and processing unit 12. In this circuit diagnostic unit 22 is adapted to send an interrupt signal $S_{INT}$ to controller 1 via the direct communication path each time a fault state of driver unit 3 is detected. Controller 1 is adapted to poll the diagnostic results from storage memory 23 upon receiving the interrupt signal $S_{INT}$. Further, interrupt signal $S_{INT}$ may already include some information on diagnostic results, such as a status bit.

Interrupt signal $S_{INT}$ interrupts a current signal processing routine of controller 1, thus reducing the time between detection of the fault state and the time when information on the fault state is provided to controller 1. Further, using interrupt signal $S_{INT}$ the number of poll processes performed by controller 1 can be reduced, because polling the diagnostic unit 22 is only required in those cases in which this is indicated by interrupt signal $S_{INT}$.

Figure 3:
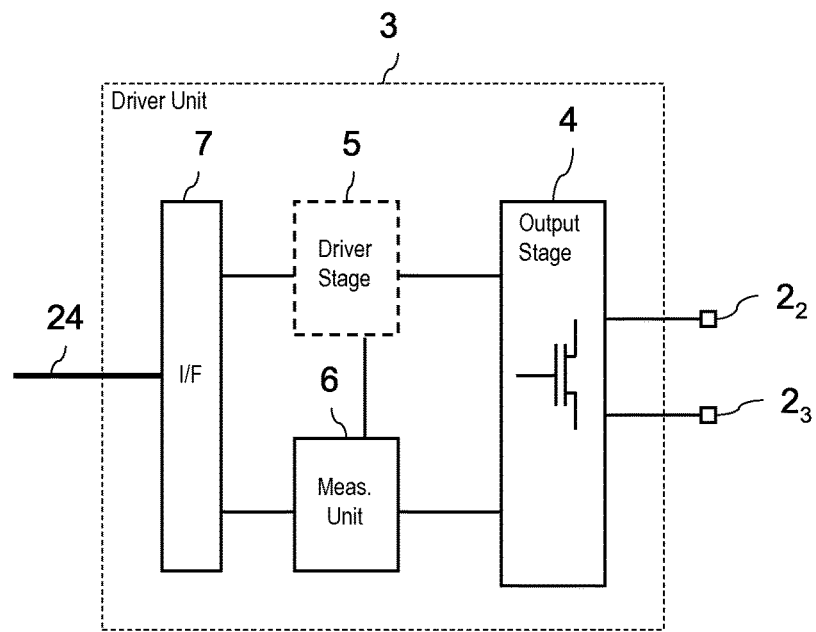
FIG. 3 illustrates a first example of the driver unit integrated in the driver circuit, the driver unit including a measurement unit.

FIG. 3 illustrates an example of driver unit 3. The driver unit according to this example includes an interface circuit 7 coupled to the internal bus 24 and being adapted to handle signal communication between driver unit 3 and other units coupled to the internal bus 24, such as diagnostic unit 22 or controller 1, the latter being coupled to internal bus 24 via the communication channel between the controller 1 and driver circuit 2. Driver unit 3 further includes an output stage 4 coupled to the at least two load or supply terminals $2_2$, $2_3$. Interface circuit 7 is coupled to output stage 4 via a control signal connection. Via this connection control or drive signals received by interface circuit 7 from controller 1 are forwarded to output stage 4. Through these control or drive signals output stage 4 can be activated in order to activate or trigger an activation element, such as a squib, coupled to the output terminals $2_2$, $2_3$. Optionally a driver stage 5 is coupled between interface circuit 7 and output stage 4. Driver stage 5 is adapted to generate from the control signals provided by interface circuit 7 drive signals suitable for driving output stage 4.

Driver unit 3 further includes a measurement unit 6 coupled to the output stage 4. Measurement unit 6 is adapted to measure operation parameters of the output stage or of optional driver stage 5, and to provide these operation parameters to the interface circuit 7 from where they can be retrieved by diagnostic unit 22. It should be mentioned that connections between the individual units of the driver unit 3 illustrated in FIG. 3 are only schematically shown. The lines between the different units illustrated in FIG. 3 do not represent physical lines between the individual units but do only illustrate connections between the individual units. It will become apparent from the following description that there can be more than one signal line between the individual units of driver unit 3.

Figure 4:
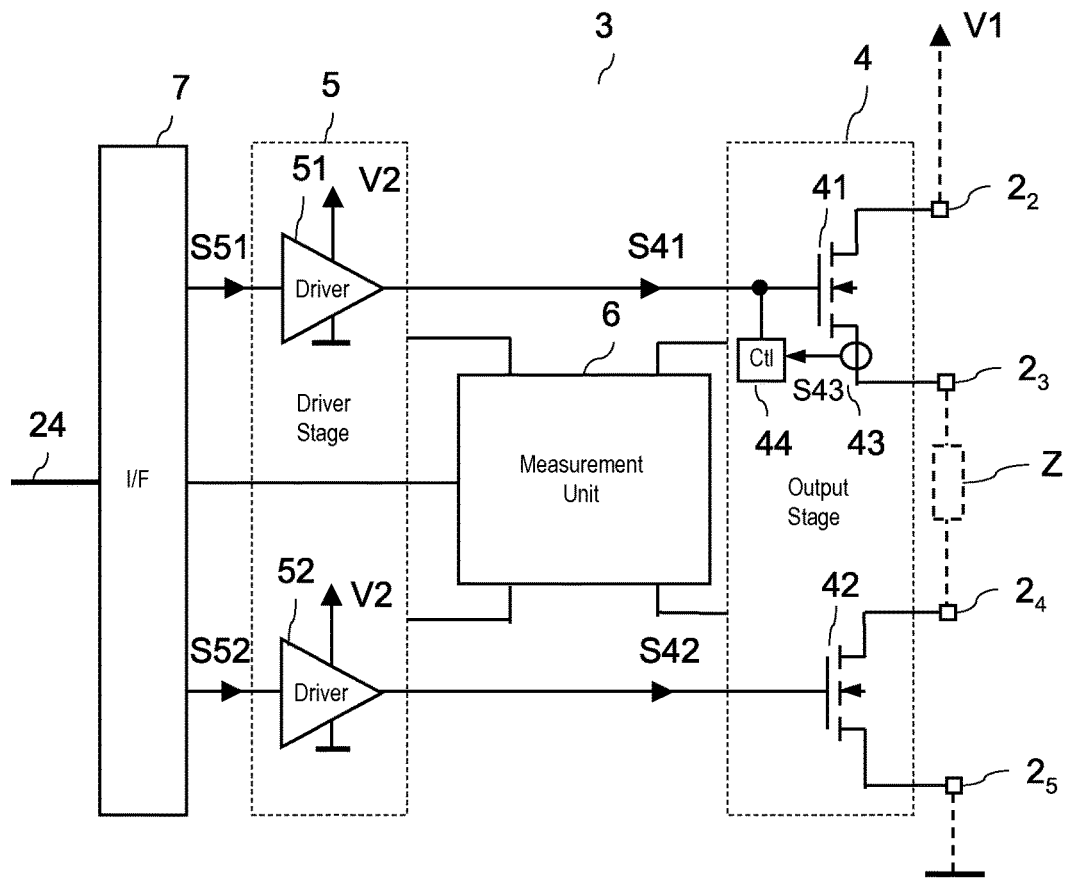
FIG. 4 illustrates details of a first example of the driver unit according to FIG. 3.

FIG. 4 illustrates a more detailed example of driver unit 3. Driver unit 3 according to FIG. 4 has an output stage 4 that is suitable for activating or firing a squib Z of an airbag system. The output stage 4 includes two transistors, such as MOSFETs, each having a control terminal and two load terminals. In case of MOSFETs the control terminal is a gate terminal, and load terminals are drain and source terminals. The driver unit has four load or supply terminals $2_2$, $2_3$, $2_4$, $2_5$, each of the transistors 41, 42 has its load terminals connected to one of these terminals. In an operable airbag system load paths of the two transistors 41, 42 are connected in series with each other and in series with squib Z, the series circuit being connected between terminals for a first and a second supply potential V1, GND. In the example of FIG. 4 the first supply potential is a positive potential, and the second supply potential is a negative supply potential or a reference potential, such as ground. This ready-to-operate wiring of a driver unit 3 in an airbag system is illustrated in dashed lines in FIG. 4. According to the example a first transistor 41, which will also be referred to as high-side transistor or high-side switch in the following, has a first load terminal (drain terminal) coupled to the positive supply potential V1 via first supply terminal $2_2$ of driver unit 3, and has its second load terminal (source terminal) connected to a first terminal of squib Z via a first load terminal $2_3$. A second transistor 42, which will also be referred to as low-side transistor or low-side switch, has its first load terminal (drain terminal) connected to a second terminal of squib Z via a second load terminal $2_4$ of driver unit 3, and has its second load terminal (source terminal) coupled to the reference potential GND via a second supply terminal $2_5$ of driver unit 3.

In the previous paragraph the information given in brackets, that relates to the load terminals of the two transistors 41, 42, is valid for an output stage 4 in which the two transistors 41, 42 are n-type MOSFET. Alternatively high-side switch 41 could be a p-type MOSFET. In this case the source of this MOSFET would be connected to the first supply terminal $2_2$, and the drain would be connected to the first load terminal $2_3$.

To activate output stage 4 both transistors 41, 42 are switched on by a first and a second control signal S41, S42 received at the control terminals of the transistors 41, 42 from interface circuit 7. Interface circuit 7 generates these two control signals S41, S42 from signals received via the internal bus 24 from controller 1. Firing a squib of an airbag system usually requires a current having a given amplitude to flow through the squib for a given time. Optionally output stage 4 has a current control circuit 44 coupled to at least one of the two transistors 41, 42 and being adapted to adjust the current flowing through the at least one transistor. Such current control circuit is schematically shown in FIG. 4. In the example the current control circuit is coupled to the first transistor 41 and includes: a current measurement unit 43 measuring a load current flow through the first transistor 41; and a control circuit 44 that adjusts the control signal S41 provided to the first transistor 41 dependent on a current measurement signal S43 provided by current measurement unit 43. The current measurement signal S43 is representative of a current flowing through the load path of transistor 41. Control circuit 44 adjusts the control signal 41 of the first transistor 41 so as to adjust the current flowing through the transistor 41 to a given value.

Optional driver stage 5 in the arrangement according to FIG. 4 includes a first driver stage 51 that provides first control signal S41, and a second driver stage 52 that provides the second control signal S42. First and second driver stages 51, 52 receive control signals S51, S52 from the interface circuit 7. These signals S51, S52 are, for example, logic signals. First and second driver stages 51, 52 are adapted to amplify these logic signals for providing the control signals of the two transistors 41, 42. Transistors 41, 42 are, for example, power transistors. A voltage to be applied between gate and source of these transistors in order to switch the transistors on is, for example, in a range between 10V and 15V.

Measurement circuit 6 that measures the operation parameters of the output stage 4 and/or driver stage 5 is only schematically illustrated in FIG. 4. In the following different examples of the measurement circuit 6 for measuring different operation parameters, such as an electrical resistance between the output terminals $2_2$, $2_3$, or the signal levels of internal or external voltages, will be illustrated with reference to figures.

Figure 5:
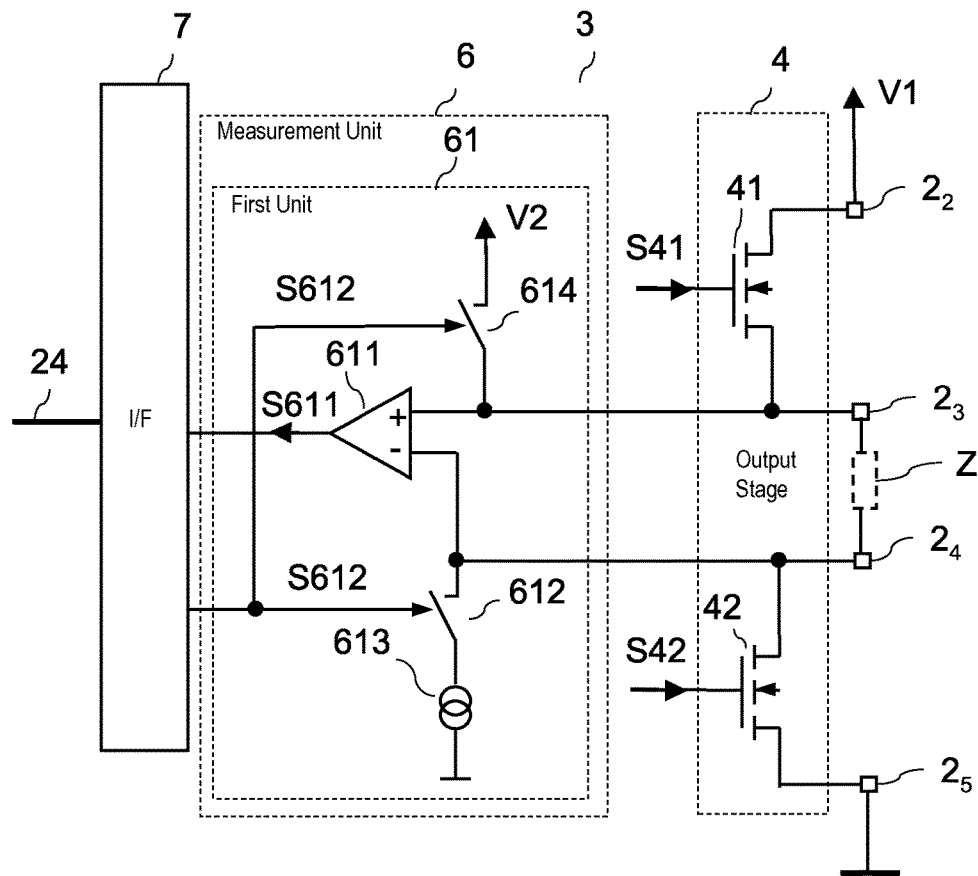
FIG. 5 illustrates a first example of the measurement unit.

FIG. 5 illustrates a first example of the measurement circuit 6. In this example measurement circuit 6 has a first unit 61 for measuring as a first operation parameter an electrical resistance between the two load terminals $2_3$, $2_4$. The electrical resistance between these two terminals $2_3$, $2_4$ indicates if a squib is present between the two terminals $2_3$, $2_4$, and if the squib has a suitable electrical resistance in order to be fired when switching first and second transistors 41, 42 on.

First unit 61 has a first current source 613, that is coupled between one of the load terminals $2_3$, $2_4$ and a first measurement unit supply potential, the second one of the two load terminals $2_3$, $2_4$ being coupled to a second measuring unit supply potential. In the example according to FIG. 5 a first measuring unit supply potential V2 is a positive potential that may correspond to a positive supply potential of driver stage 5 (see FIG. 4). The second measuring unit supply potential may be reference potential GND. The first measuring unit supply potential V2 is in particular suitable to power the different components of the measuring unit, such as amplifiers, comparators, etc.

In the example according to FIG. 5 the first current source 613 is connected between the second load terminal $2_4$ and reference potential GND, while the first load terminal $2_3$ is coupled to the first measuring unit supply potential V2. However, this is only an example, current source 613 could also be connected between the first load terminal $2_3$ and the first supply potential V2. In the example illustrated in FIG. 5, the first load terminal $2_3$ is coupled to the supply potential via a switch 614.

First current source 613 can be activated and deactivated. In order to measure the electrical resistance between the output terminals $2_3$, $2_4$ current source 613 is activated and the first load terminal $2_3$ is connected to the supply potential V2 by switching switch 614 on. For activating and deactivating current source 613 a further switch 612 is connected in series to current source 613, the current source 613 is activated each time switch 612 is closed, and the current source 613 is deactivated each time the switch 612 is open. First switch 612 is opened and closed by an activation signal S612 that is provided by interface circuit 7 and that assumes one of an activation and a deactivation level. This activation signal S612 controls both, the switch connected between the first output terminal $2_3$ and the first supply potential and the switch 612 which activates and deactivates the current source 613. The switches 612, 614 are closed to activate the current source 613, when the activation signal S612 has an activation level, and are opened to deactivate current source 613, when the activation signal S612 has its deactivation level. The switches 612, 614 are only schematically illustrated in FIG. 5. It should be noted that any electrically controllable switch, such as a transistor, can be used. It should further be noted, that activating or deactivating a current source by switching on or off a switch connected in series to the current source, is only an example. Of course any other means for activating or deactivating a current source may be used as well.

First unit 61 further includes a differential amplifier 611 having a first input coupled to the first load terminal $2_3$, and a second input coupled to the second load terminal $2_4$. In the example the first amplifier input is a non-inverting input, while the second amplifier input is an inverting input. First unit 61 is activated if activation signal S612 has an activation level so that current source 613 draws a current through squib Z. A voltage drop across squib Z that is measured by differential amplifier 611 is representative of the electrical resistance of squib Z. If this voltage is larger than a given threshold, or even equals to the voltage present between the first measuring unit supply potential V2 and reference potential GND, it is assumed that squib Z is either defect, or that no squib is present.

Differential amplifier 611 provides an output signal S611 that is representative of the voltage between the load terminals $2_3$, $2_4$, and that is therefore representative of the electrical resistance between these two terminals $2_3$, $2_4$. Interface circuit 7 receives the measurement signal S611 and makes this measurement signal S611 available to diagnostic unit 22 (see FIGS. 1 and 2) via internal bus 24.

Figure 6:
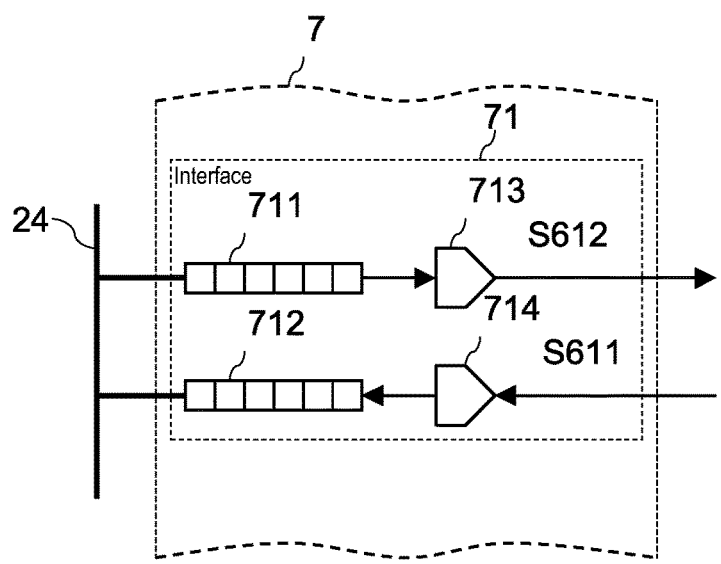
FIG. 6 illustrates an example of an interface unit handling communication between the driver unit and other components of the driver circuit.

FIG. 6 illustrates with reference to an example how signals or information can be transferred between internal bus 24 and the individual function blocks of driver unit 3. This example illustrates the communication between internal bus 24 and the first unit 61 as illustrated in FIG. 5. However, the concept illustrated in FIG. 6 applies to the other function blocks of driver unit 3 in a similar manner.

To handle the communication between internal bus 24 and first unit 61 of measurement circuit 6 interface circuit 7 has a first interface unit 71. Interface unit 71 has two storage memories, such as registers 711, 712 that are coupled to internal bus 24. First register 711 stores a digital representation of the activation signal S612 provided to first switch 612, and second register 712 stores a digital equivalent of the output signal 611 of differential amplifier 611. The digital representation of activation signal 612 can be written into first register 711 by diagnostic unit 22 via internal bus 24. Further, the digital representation of measurement signal S611 can be read from the second register 712 by diagnostic unit 22 via internal bus 24. A transfer protocol for transferring data between diagnostic unit 22 and registers of the first interface unit 71 can be any transfer protocol suitable for writing data into the registers of the first interface unit 71 and for reading data from these registers. According to an embodiment an On-Chip-Bus, like an Address and Data Bus (not shown), is used for exchanging data between the diagnostic unit 22 and the first interface unit 71. The use of an SPI-interface helps to reduce the number of communication lines that are required between the diagnostic unit 22 and the first interface unit 71.

A first digital-to-analog converter (DAC) is connected to the first register 711 and provides activation signal S612 from the digital representation of this signal stored in the first register 711. The digital representation of measurement signal S611 is generated by an analog-to-digital converter (ADC) from measurement signal S611 and stored in the second register 712.

Referring to the explanation hereinabove, diagnostic unit 22 is adapted to regularly retrieve at least one operation parameter from driver unit 3. An interaction between diagnostic unit 22 and driver unit 3 for retrieving an operation parameter will now shortly be explained with reference to the examples illustrated in FIGS. 5 and 6. In a first step diagnostic unit 22 activates first unit 61 by writing a digital word representing an activation level of activation signal S612 into the first register 711. In a next step diagnostic unit 22 reads the digital words representing the voltage between the output terminal $2_3$, $2_4$ from the second register 712. The value retrieved from the second register 712 corresponds to the operation parameter. This operation parameter is processed in the diagnostic unit 22 by, for example, comparing the operation parameter to a reference value. Diagnostic unit 22 provides a diagnostic result that is dependent on the result of processing the operation parameter and writes the diagnostic result into storage memory 23. After reading the operation parameter from second register 712 first unit 61 is deactivated by setting the data word stored in the first register 711 to a suitable value, which causes the switches 612, 614 to be opened. First unit 61 stays deactivated until it is again activated for a next cycle of obtaining the operation parameter.

Controller 1 need not be involved in the process of obtaining the operation parameter from driver unit 3 and in evaluating operation parameter, but only needs to retrieve the diagnostic result from storage memory 23 of driver circuit 2. The workload of the controller is thus reduced.

According to an example, controller 1 is also adapted to perform the diagnostic functions performed by diagnostic unit 22. In this case controller 1 via the communication channel between controller 1 and driver circuit 2, and via internal bus 24 accesses driver unit 3 and retrieves operation parameters directly from driver unit 3. In this way controller 1 may, for example, verify diagnostic results obtained by diagnostic unit 22. The "verification of diagnostic" results may include a comparison of a first diagnostic result obtained from diagnostic unit 22 with a second diagnostic result obtained by controller 1, with the second diagnostic result being obtained by directly retrieving operation parameters from driver unit 3. In case the first and the second diagnostic results are identical, proper operation of the system can be assumed. Otherwise, an error in the diagnostic unit 22 or the controller 1 could be present. In case of an error, different actions can be taken, such as notifying the user or transferring the system into a safe operating state.

Figure 7:
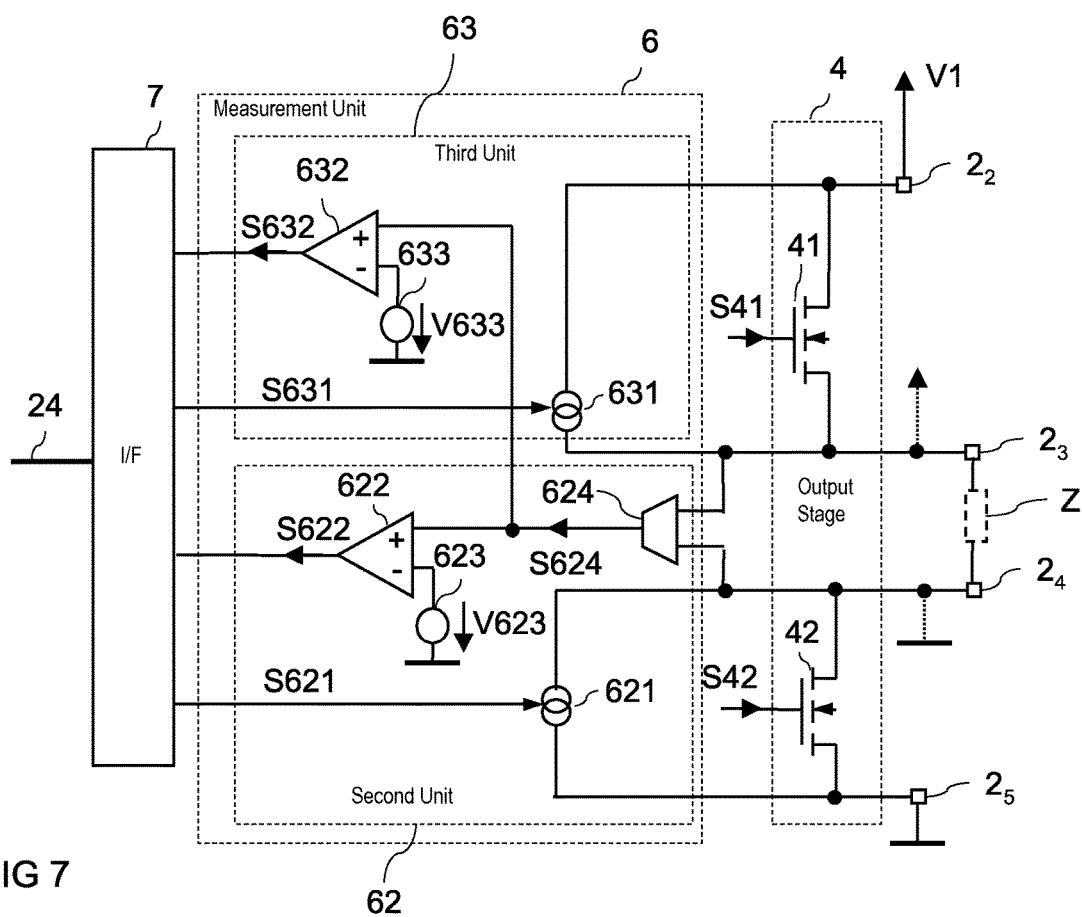
FIG. 7 illustrates a second example of the measurement unit.

FIG. 7 illustrates a second example of a measurement circuit 6. This measurement circuit 6 includes a second unit 62. Second unit 62 provides information on a second operation parameter represented by output signal S622 of the second unit 62. The second operation parameter measured by the second unit 62 is a first leakage current between a voltage source, such as the voltage source providing the first supply voltage or such as the battery of the vehicle, and the first output terminal $2_3$. A leakage scenario in which there is a leakage current between a voltage source and the first output terminal $2_3$ is illustrated in dotted lines in FIG. 7. A current path which allows this leakage current to flow can be within the driver circuit (as schematically illustrated in FIG. 7) or outside the driver circuit.

The second unit 62 includes a first current source 621 connected between the second output terminal $2_4$ and a node for a reference potential, such as the second supply terminal $2_5$. A voltage measurement unit 624 is connected between the first and second output terminals $2_3$, $2_4$ and is adapted to provide a voltage measurement signal S624 which is representative of a voltage between the output terminals $2_3$, $2_4$. A comparator 622 receives the voltage measurement signal S624 and is configured to compare the voltage measurement signal S624 with a reference signal V623 provided by a reference voltage source 623, and is configured to provide the output signal S622 of the second unit dependent on this comparison.

For measuring the second operation parameter first current source 621 is activated by an activation signal S621 provided by interface circuit 7. Activation signal S621 is received by interface circuit 7 via the internal bus 24 by, for example, diagnostic circuit 22. The first operation parameter S622 is retrieved from the interface circuit 7 by, for example, diagnostic circuit 22 via the internal bus 24. Concerning the steps of forwarding the activation signal S621 from the internal bus 24 to the first current source 621 and concerning the steps of retrieving the second operation parameter, that is represented by the output signal S622, via the internal bus 24 by diagnostic circuit 22 the explanations that have been made with respect to signals S611, S612 illustrated in FIGS. 5 and 6 apply accordingly.

Second unit 62 is activated to measure the second operation parameter when the first current source 621 is activated by the first activation signal S621. In case there is no leakage current path between the voltage source and the first output terminal $2_3$ that bypasses the load path of blocking transistor 41, no current or only a minimum current flows through the load Z driven by the first current source 621. A voltage drop between the output terminals $2_3$, $2_4$ is in this case lower than the first reference voltage V623. If, on the other hand, there is a leakage current, the voltage drop between the output terminals $2_3$, $2_4$ is significantly higher compared with the scenario in which there is no leakage current. In the example illustrated comparator 622 has its non-inverting input connected to the voltage measurement unit, and has its inverting input connected to the reference voltage source 623. If there is no leakage current path between the voltage source and the first output terminal $2_3$ the output signal S622, in this case, has a low signal level, while the output signal S622 has a high signal level when there is a leakage current. However, this is only an example. The inputs of the comparator 622 could be changed, where in this case a low signal level of signal S622 would indicate a leakage current or a leakage current above a given threshold value, respectively, while a high signal level would indicate no leakage current, or a leakage current below the given threshold value. In the second diagnostic unit 62 the comparator could be replaced by a differential amplifier that provides an output signal S622 which represents the difference between the voltage drop across the load Z and the reference voltage V623. Providing this difference to the interface unit 7 instead of a digital signal—which is only capable of providing the information on whether there is a leakage current or not enables the processing unit 22 to better evaluate a possible leakage scenario.

The output signal S622 of the second unit 62 is evaluated by diagnostic unit 22. Diagnostic unit 22 is configured to detect a fault state of driver unit 3, if this output signal S622 has a signal level that indicates a leakage current.

Optionally there is a third unit 63 that is configured to detect a leakage current between the second output terminal $2_4$ and a terminal for a reference potential, such as the second supply terminal $2_5$. Third unit 63 provides information on a third operation parameter represented by an output signal S632 of the third unit 63. The third operation parameter measured by the third unit 63 is a second leakage current between the second output terminal $2_4$ and a terminal for a reference potential. A leakage scenario in which there is a leakage current between a voltage source and the first output terminal $2_3$ is illustrated in dotted lines in FIG. 7. An electric connection that causes a leakage current can be present inside the driver unit 4 (as illustrated) or outside the driver unit 4.

The third unit 63 includes a second current source 631 connected between the first output terminal $2_3$ and a node for a reference potential. The node for the reference potential is the first supply terminal $2_2$ in the example illustrated in FIG. 7. However, any other supply potential can be used as well. The third unit 63 further includes a comparator 632 which receives the voltage measurement signal S624 from the voltage measurement unit 624—which is common to the second and the third evaluation unit. The comparator 632 is adapted to compare the voltage measurement signal S624 with a reference voltage V633 provided by a reference voltage source 633, and is adapted to provide the output signal S632 of the third unit 63 dependent on this comparison.

To measure the third operation parameter second current source 631 is activated by a second activation signal S631 provided by interface circuit 7. Activation signal S631 is received by interface circuit 7 via the internal bus 24 by, for example, diagnostic circuit 22. The first operation parameter S632 is retrieved from the interface circuit 7 by, for example, diagnostic circuit 22 via the internal bus 24. Concerning the steps of forwarding the activation signal S631 from the internal bus 24 to the first current source 631 and concerning the steps of retrieving the second operation parameter, that is represented by the output signal S632, via the internal bus 24 by diagnostic circuit 22 the explanations that have been made with respect to signals S611, S612 illustrated in FIGS. 5 and 6 apply accordingly.

Third unit 63 is activated to measure the third operation parameter when the second current source 631 is activated by the second activation signal S631. In case there is no leakage current path that bypasses the load path of blocking transistor 42, no current or only a minimum current flows through the load Z driven by the second current source 631. A voltage drop across the load Z is in this case lower than the second reference voltage V633. If, on the other hand, there is a leakage current, the voltage drop across the load Z is significantly higher compared with the scenario in which there is no leakage current. In the example illustrated comparator 622 has its non-inverting input connected to the first load terminal $2_3$, and has its inverting input connected to the reference voltage source 633. If there is no leakage current path between the voltage source and the first output terminal $2_3$ the output signal S622, in this case, has a low signal level, while the output signal S622 has a high signal level when there is a leakage current. However, this is only an example. The inputs of the comparator 632 could be changed, where in this case a low signal level of signal S632 would indicate a leakage current or a leakage current above a given threshold value, respectively, while a low signal level would indicate no leakage current, or a leakage current below the given threshold value. Like in the second unit 62 the comparator 635 of the third unit 63 could be replaced by a differential amplifier. Further, the second and the third evaluation unit 62, 63 could be implemented with a common comparator or differential amplifier instead of providing the two comparators or differential amplifiers 622, 635.

The output signal S632 of the third unit 63 is evaluated by diagnostic unit 22. Diagnostic unit 22 is configured to detect a fault state of driver unit 3, if this output signal S622 has a signal level that indicates a leakage current.

In order to prevent that the methods for measuring the first and the second leakage current path influence each other, according to an example only one of the current sources 621, 631, and, therefore, only one of the measuring units are activated at one time.

Figure 8:
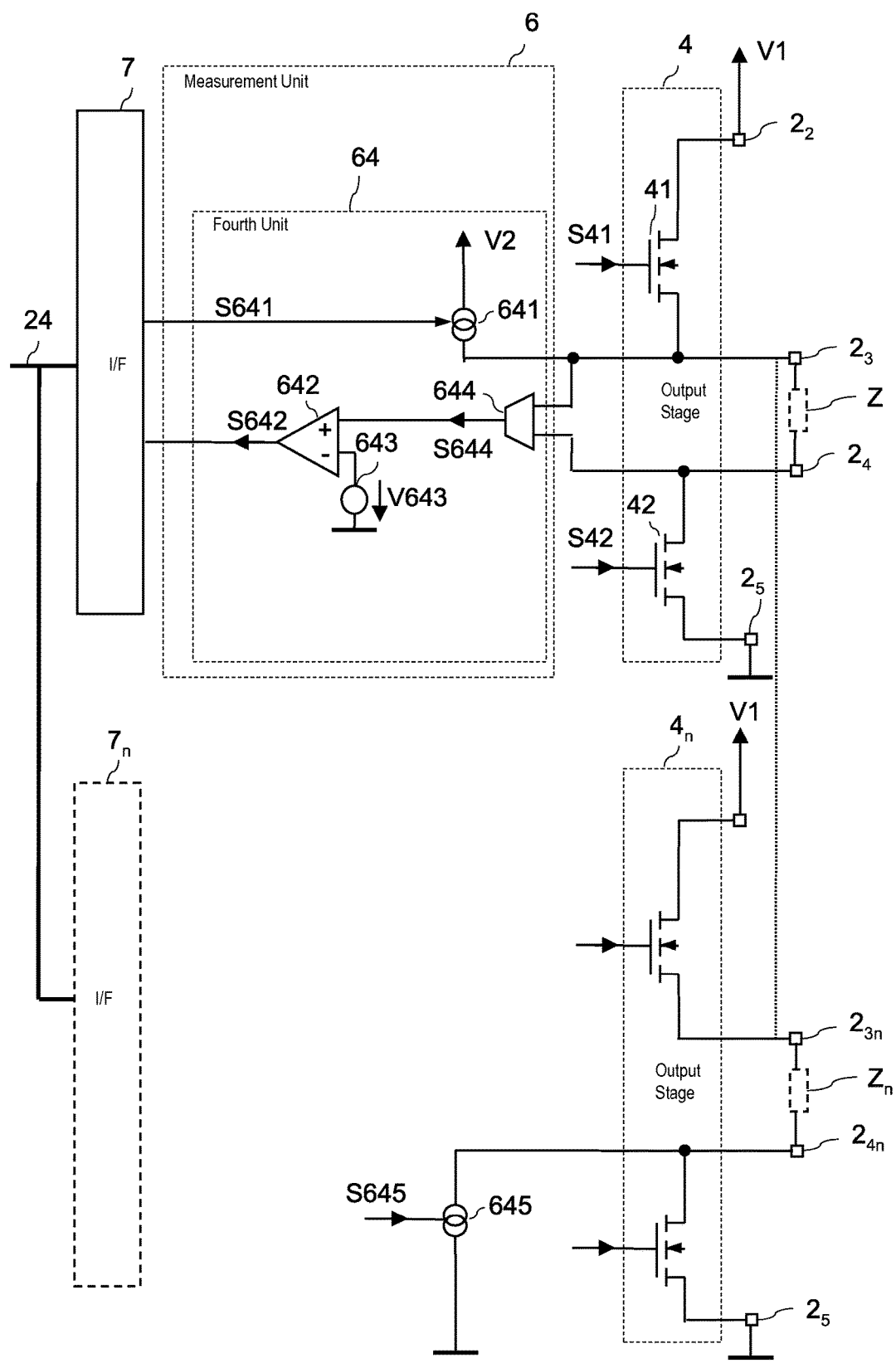
FIG. 8 illustrates a third example of the measurement unit.

FIG. 8 illustrates a further example of a measurement circuit 6. This measurement circuit 6 includes a fourth unit 64 that provides information on a fourth operation parameter represented by an output signal S642 of the fourth unit 64. The fourth operation parameter measured by the fourth unit 64 is a leakage current between different channels in a system that includes several channels. Each channel involves a driver stage for driving a firing element. In FIG. 8, besides the channel including driver stage 4 that has been explained before, the driver stage $4_n$ of a second channel is illustrated. A leakage scenario in which a leakage current can flow between these two channels—which in the present example means between the first output terminals $2_3$, $2_{3n}$ of the two channels—is illustrated in dotted lines in FIG. 8.

The fourth unit 64 includes a first current source 641 connected between a terminal for a supply potential V2 and the first output terminal $2_3$. The fourth unit 64 further includes a voltage measurement unit 644 which is connected between the first and second output terminals $2_3$, $2_4$ and is adapted to provide a voltage measurement signal S644 which is representative of a voltage between the output terminals $2_3$, $2_4$. A comparator 642 receives the voltage measurement signal S644 and is configured to compare the voltage measurement signal S644 with a reference voltage V643 provided by a reference voltage source 643. The comparator 642 provides the output signal S642 of the fourth unit 64 dependent on this comparison.

The fourth unit further includes a second current source 645 connected between a second output terminal $2_{4n}$ of the second channel and a terminal for a reference potential, such as, for example, ground. The second current source can be activated and deactivated by a control signal S645. This signal is either provided from the interface circuit 7 of the first channel or from a corresponding interface circuit $7_n$ (shown in dashed lines) of the second channel.

In order to measure a leakage current between the two channels the first and second current sources 641, 645 are activated by activation signals S641, S645 provided by the interface circuit 7. The activation signals S641, S645 are received by interface circuit 7 via the internal bus 24 by, for example, diagnostic unit 22. The fourth operation parameter S642 is retrieved from the interface circuit 7 by, for example, diagnostic circuit 22 via the internal bus 24. Concerning the steps of forwarding the activation signal S641 from the internal bus 24 to the current source 641 and concerning the steps of retrieving the fourth operation parameter, that is represented by the output signal S642, via the internal bus 24 by diagnostic circuit 22 the explanations that have been made with respect to signals S611, S612 illustrated in FIGS. 5 and 6 apply accordingly.

The fourth unit 64 is activated to measure the fourth operation parameter when the current sources 641, 645 are activated by the corresponding activation signals S641, S645. When there is a leakage current path between the two channels, then there is a significant voltage drop between the output terminals $2_3$, $2_4$ caused by a current driven through the load Z by the first and second current sources 641, 645. When this voltage drop is higher than the reference voltage V643 provided by the reference voltage source 643, the comparator output signal S642 assumes a high signal level which indicates the presence of a leakage current path between the two channels. Like in the second and third evaluation units explained with reference to FIG. 7 the comparator 642 could be replaced by a differential amplifier. It should be noted, that two or more of the units 61, 62, 63, 64 that measure an operation parameter of either output stage 4 or driver stage 5 can be implemented in the measurement circuit 6.

Figure 9:
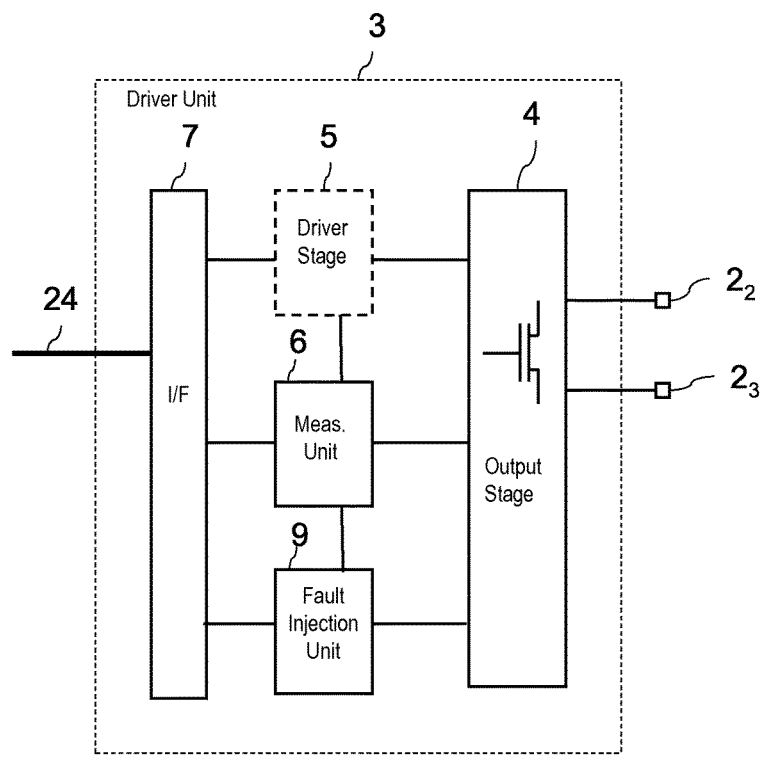
FIG. 9 illustrates a second example of the driver unit integrated in the driver circuit, the driver unit including a measurement unit and a fault injection unit.

FIG. 9 illustrates a further example of driver unit 3. Driver unit 3 according to FIG. 9 is different from the driver unit 3 of FIG. 3, in that additionally to an interface circuit, a measurement unit, an output stage, and an optional driver stage a fault-injection unit 9 is present. The general function of fault-injection circuit 9 is to simulate a fault state in the driver unit 3.

Figure 10:
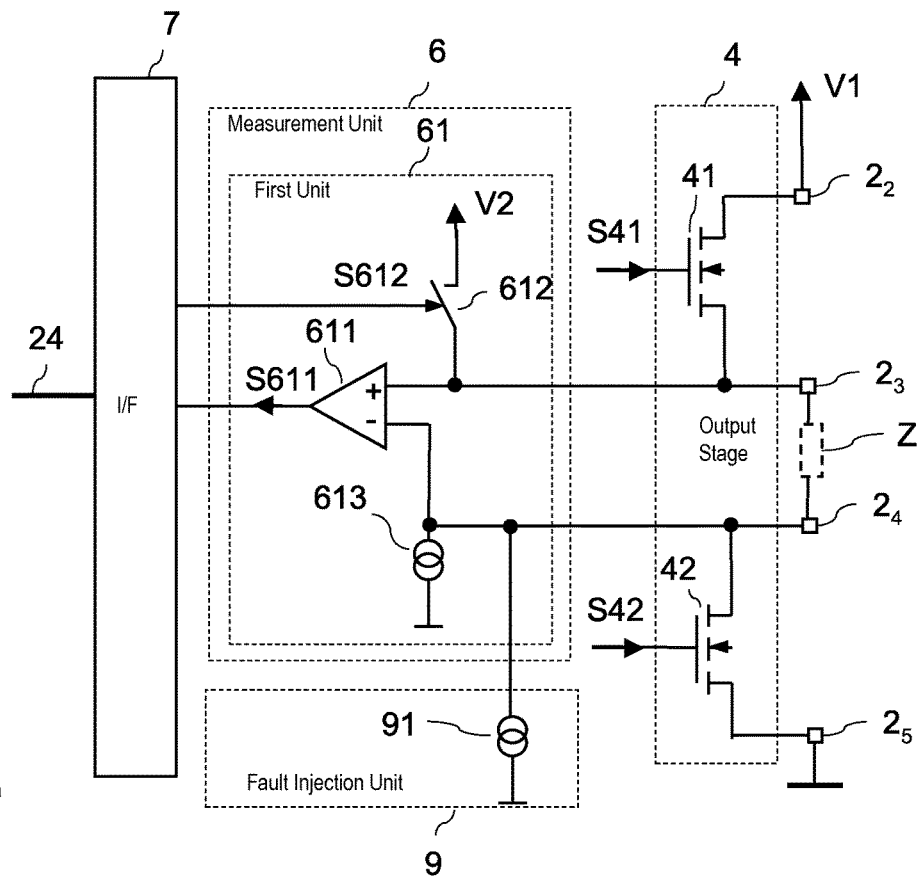
FIG. 10 illustrates an example of the measurement unit and the fault injection unit.

Referring to FIG. 10, the functionality of the fault-injection unit 9 will be explained with reference to the example in which the resistance between the load terminals $2_3$, $2_4$ is measured as an operation parameter. For measuring this operation parameter the first unit 61 that has been explained with reference to FIGS. 5 and 6 can be used. For injecting a fault into this measuring unit 61 fault-injection unit 9 includes a current source 91 connected in parallel to first current source 613 of the first unit 61. Current source 91 of fault-injection unit 9 can be activated and deactivated via an activation signal S91. Activation signal S91, like activation signal S612 for the first current source 613 is provided by diagnostic unit 22 or controller 1 via internal bus 24. If current source 91 of fault-injection unit 9 is activated, a higher current flows through squib Z resulting in a higher voltage drop between the output terminals $2_3$, $2_4$. A current provided by current source 91 is selected such that even for a squib Z having a resistance that is in a normal resistance range the voltage drop between the output terminals $2_3$, $2_4$ increases above the threshold that indicates a fault state. Thus, by activating current source 91 a fault-state can be simulated. In this way diagnostic unit 22 and/or controller 1 can verify proper functionality of first unit 61. First unit 61 functions properly, if, after activating current source 91, the output signal S611 reaches across the given threshold.

According to a further embodiment, the data lines used for signal communication between the diagnostic unit 22 and the driver unit 3, or for signal communication between the controller 1 and the driver circuit 2 are regularly checked. For this purpose a test signal generator (not shown) may be connected to the data lines at one end, such as those ends of the data lines distant to the diagnostic circuit 22 or the controller 1. Test signal generator is configured to regularly send test signals via the data lines that are evaluated by the diagnostic circuit 22 and/or the controller 1. An error of the data lines is detected when no test signal is received after a given time period. Evaluation of the test signal may be performed using a watchdog in the diagnostic circuit 22 and/or the controller 1.

Finally it should be mentioned that features having been explained with reference to one embodiment can be combined with features of other embodiments, even if this has not been explicitly mentioned.

What is claimed is:

1. A circuit arrangement comprising:
  a controller and an integrated driver circuit coupled to a communication port of the controller, wherein the integrated driver circuit comprises
    an electronic output driver unit comprising a first transistor configured to drive a load, wherein the electronic output driver unit is configured to determine at least one operation parameter indicating whether the electronic output driver unit is in a fault state, and
    a diagnostic unit coupled to the electronic output driver unit and coupled to an interrupt port of the controller, wherein the interrupt port is different from the communication port,
    wherein the diagnostic unit is adapted to retrieve the at least one operation parameter from the electronic output driver unit, evaluate the at least one operation parameter in order to obtain a diagnostic result, store the diagnostic result in a storage memory, and send an interrupt signal to the controller via the interrupt port upon detection of the fault state of the output driver unit, and
    wherein the controller, via the communication port, is configured to read out the diagnostic result stored in the memory upon receipt of the interrupt signal from the diagnostic unit.

2. The circuit arrangement of claim 1, further comprising a storage memory coupled to the diagnostic unit and the controller.

3. The circuit arrangement of claim 2, wherein the diagnostic unit is adapted to store the at least one operation parameter in the storage memory.

4. The circuit arrangement of claim 2, wherein the diagnostic unit is adapted to evaluate the at least one operation parameter in order to obtain a diagnostic result, and is adapted to store the diagnostic result in the storage memory.

5. The circuit arrangement of claim 1, further comprising a communication channel between the controller and the integrated driver circuit.

6. The circuit arrangement of claim 5, wherein the integrated driver circuit further comprises an internal bus, wherein the diagnostic unit, the electronic output driver unit, and the communication channel are coupled to the internal bus.

7. The circuit arrangement of claim 5, further comprising an interrupt channel between the diagnostic unit and the controller.

8. The circuit arrangement of claim 2, further comprising an interrupt signal channel between the diagnostic unit and the controller.

9. The circuit arrangement of claim 1, wherein the controller is a microcontroller.

10. The circuit arrangement of claim 1, wherein the controller and the integrated driver circuit are integrated in at least two separate integrated circuits.

11. The circuit arrangement of claim 1, further comprising a sensor coupled to the controller.

12. The circuit arrangement of claim 1, wherein the electronic output driver unit comprises:

an output stage having at the least one operation parameter;
a measurement unit coupled to the output stage and adapted to measure the at least one operation parameter; and
an interface circuit coupled to the diagnostic unit and the measurement unit.

13. The circuit arrangement of claim 12, further comprising a driver stage coupled between the interface circuit and the output stage.

14. The circuit arrangement of claim 13, wherein the measurement unit is coupled to the driver stage.

15. The circuit arrangement of claim 12, wherein the output stage comprises:
the first transistor having a control terminal and a load path, and having its load path coupled between a first supply terminal and a first load terminal of the electronic output driver unit; and
a second transistor having a control terminal and a load path, and having its load path coupled between a second supply terminal and a second load terminal of the electronic output driver unit.

16. The circuit arrangement of claim 15, wherein the measurement unit is adapted to measure an electrical resistance between the first and second load terminals as an operation parameter.

17. The circuit arrangement of claim 12, wherein the electronic output driver unit further comprises a fault injection that can be activated and deactivated, and that is coupled to the interface circuit and to the measurement unit.

18. The circuit arrangement of claim 3, wherein the diagnostic unit is coupled to the controller via an interrupt channel, and wherein the controller is configured to poll the at least one operation parameter from the storage memory via a communication channel different from the interrupt channel.

19. The circuit arrangement of claim 18, wherein the controller is configured to poll the at least one operation parameter from the storage memory upon receiving an interrupt signal from the diagnostic unit via the interrupt channel.

20. The circuit arrangement of claim 18, wherein the output driver unit, the diagnostic unit, and the storage memory are coupled to an internal bus, wherein the internal bus is coupled to the communication channel.

21. The circuit arrangement of claim 20, wherein the internal bus is coupled to the communication channel via an interface circuit.

22. The circuit arrangement of claim 1, wherein the diagnostic unit is adapted to regularly poll the at least one operation parameter from the electronic output driver unit and to evaluate the retrieved operation parameter.

23. A circuit arrangement comprising:
a controller and an integrated driver circuit coupled to a communication port of the controller, wherein the integrated driver circuit comprises
an electronic output driver unit comprising a first load terminal and a second load terminal,
an output stage disposed in the electronic output driver unit and comprising a first transistor configured to drive a load between the first and the second load terminals,
a measurement circuit disposed in the electronic output driver unit and coupled to the output stage, the measurement circuit configured to measure at least one operation parameter at the first load terminal and/or second load terminal, wherein the at least one operation parameter is configured to indicate whether the electronic output driver unit is in a fault state, and
a diagnostic unit coupled to the electronic output driver unit and coupled to an interrupt port of the controller, wherein the interrupt port is different from the communication port,
wherein the diagnostic unit is adapted to retrieve the at least one operation parameter from the electronic output driver unit, evaluate the at least one operation parameter in order to obtain a diagnostic result, store the diagnostic result in a storage memory, and send an interrupt signal to the controller via the interrupt port upon detection of the fault state of the output driver unit, and
wherein the controller, via the communication port, is configured to read out the diagnostic result stored in the memory upon receipt of the interrupt signal from the diagnostic unit.

24. The circuit arrangement of claim 23, wherein the output stage comprises:
the first transistor having a control terminal and a load path, and having its load path coupled between a first supply terminal and the first load terminal; and
a second transistor having a control terminal and a load path, and having its load path coupled between a second supply terminal and the second load terminal.

25. The circuit arrangement of claim 23, wherein the measurement circuit is configured to measure a voltage drop across the first load terminal and the second load terminal.

26. The circuit arrangement of claim 25, wherein the measurement circuit comprises a differential amplifier having a first input coupled to the first load terminal and a second input coupled to the second load terminal.

27. The circuit arrangement of claim 23, wherein the measurement circuit is configured to measure a leakage current at the first load terminal and/or the second load terminal.

28. The circuit arrangement of claim 27, wherein the measurement circuit comprises a voltage measurement unit coupled in parallel between the first load terminal and the second load terminal, and a comparator comprising a first input coupled to an output of the voltage measurement unit and a second input coupled to a reference voltage source.

29. The circuit arrangement of claim 23, further comprising:
an interface circuit disposed in the electronic output driver unit and coupled to the measurement circuit, the interface circuit comprising registers to store a digital representation of an activation signal to activate the measurement circuit and a digital representation of the at least one operation parameter.

30. The circuit arrangement of claim 23, wherein the controller is coupled to the electronic output driver unit through an internal bus, wherein the diagnostic unit is adapted to retrieve the at least one operation parameter directly from the electronic output driver unit, and wherein the controller is configured to verify working of the diagnostic unit based on the at least one operation parameter directly retrieved from the electronic output driver unit.

31. The circuit arrangement of claim 23, wherein the diagnostic unit is adapted to regularly poll the at least one operation parameter from the electronic output driver unit and to evaluate the retrieved operation parameter.

32. A circuit arrangement comprising:
a controller and an integrated driver circuit coupled to the controller, wherein the integrated driver circuit comprises
an electronic output driver unit comprising a first transistor configured to drive a load, the electronic output driver unit configured to determine at least one operation parameter indicating whether the electronic output driver unit is in a fault state,
a diagnostic unit coupled to the electronic output driver unit, the diagnostic unit being adapted to retrieve the at least one operation parameter from the electronic output driver unit, wherein the diagnostic unit is coupled to the controller,
a storage memory coupled to the diagnostic unit and the controller, wherein the diagnostic unit is adapted to store the at least one operation parameter in the storage memory, wherein the diagnostic unit is coupled to the controller via an interrupt channel, and wherein the controller is configured to poll the at least one operation parameter from the storage memory via a communication channel different from the interrupt channel, wherein the controller is configured to poll the at least one operation parameter from the storage memory upon receiving an interrupt signal from the diagnostic unit via the interrupt channel.

* * * * *